United States Patent
Lee et al.

(10) Patent No.: US 7,482,966 B2
(45) Date of Patent: Jan. 27, 2009

(54) ALGORITHM ANALOG-TO-DIGITAL CONVERTER

(75) Inventors: Seung Chul Lee, Daejeon (KR); Young Deuk Jeon, Daejeon (KR); Kwi Dong Kim, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/946,583

(22) Filed: Nov. 28, 2007

(65) Prior Publication Data

US 2008/0136699 A1 Jun. 12, 2008

(30) Foreign Application Priority Data

Dec. 6, 2006 (KR) .................. 10-2006-0123205

(51) Int. Cl.
*H03M 1/38* (2006.01)
(52) U.S. Cl. .................. 341/161; 341/118; 341/120; 341/155; 341/162; 341/172
(58) Field of Classification Search ......... 341/118–122, 341/155, 161, 162, 163, 172
See application file for complete search history.

(56) References Cited

U.S. PATENT DOCUMENTS

| | | | |
|---|---|---|---|
| 5,889,486 A | 3/1999 | Opris et al. | |
| 6,097,326 A | 8/2000 | Opris et al. | |
| 6,211,806 B1 * | 4/2001 | McCarroll | 341/161 |
| 6,366,230 B1 * | 4/2002 | Zhang et al. | 341/162 |
| 6,420,991 B1 | 7/2002 | Yu | |
| 6,486,820 B1 * | 11/2002 | Allworth et al. | 341/161 |
| 6,617,992 B2 * | 9/2003 | Sakurai | 341/161 |
| 6,778,110 B2 * | 8/2004 | Jansson | 341/120 |
| 6,784,824 B1 * | 8/2004 | Quinn | 341/172 |
| 6,882,292 B1 * | 4/2005 | Bardsley et al. | 341/121 |
| 7,031,395 B2 | 4/2006 | Hinrichs et al. | |
| 7,068,202 B2 | 6/2006 | Waltari | |
| 7,088,277 B2 * | 8/2006 | Kobayashi et al. | 341/155 |

(Continued)

FOREIGN PATENT DOCUMENTS

JP 2000-201077 7/2000

(Continued)

OTHER PUBLICATIONS

Min Gyu Kim, et al.; "A 10/MS/s 11-b 0.19mm Algorithmic ADC with Improved Clocking;" 2006 IEEE Symposium on VLSI Circuits Digest of Technical Papers.

(Continued)

*Primary Examiner*—Linh V Nguyen
(74) *Attorney, Agent, or Firm*—Ladas & Parry LLP

(57) ABSTRACT

Provided is an algorithm analog-to-digital converter (ADC). The algorithm ADC obtains two digital outputs through different capacitor connections for one analog input signal and adds the digital output signals to obtain a final output value, so that a mismatch factor of the capacitor is removed to minimize a linearity limitation resulting from the capacitor mismatch. In addition, the algorithm ADC minimizes power consumption by making the operating frequency slow at a cycle requiring a high resolution and making the operating frequency fast at a cycle requiring a low resolution, i.e., outputting different operating clock frequencies according to a required resolution.

13 Claims, 7 Drawing Sheets

U.S. PATENT DOCUMENTS

| | | | |
|---|---|---|---|
| 7,248,198 B2 * | 7/2007 | Moon | 341/162 |
| 7,268,720 B1 * | 9/2007 | Murden et al. | 341/161 |
| 7,339,512 B2 * | 3/2008 | Gulati et al. | 341/172 |
| 2004/0233092 A1 | 11/2004 | Hong | |
| 2005/0068219 A1 * | 3/2005 | Kobayashi et al. | 341/161 |
| 2005/0140537 A1 | 6/2005 | Waltari | |
| 2006/0187108 A1 * | 8/2006 | Moon | 341/161 |

FOREIGN PATENT DOCUMENTS

| | | |
|---|---|---|
| KR | 1995-0022002 | 7/1995 |
| KR | 1999-0036595 | 5/1999 |
| KR | 10-0345668 B1 | 1/2001 |

OTHER PUBLICATIONS

Jere A. M. Jarvinen, et al; "A 12-bit 32 $u$W Ratio-Independent Algorithmic ADC;" 2006 IEEE Symposium on VLSI Circuits Digest of Technical Papers.

* cited by examiner

ALGORITHM ANALOG-TO-DIGITAL CONVERTER

CROSS-REFERENCE TO RELATED APPLICATION

This application claims priority to and the benefit of Korean Patent Application No. 2006-123205, filed Dec. 6, 2006, the disclosure of which is incorporated herein by reference in its entirety.

BACKGROUND

1. Field of the Invention

The present invention relates to an algorithm analog-to-digital converter (ADC) and, more particularly, to an algorithm ADC in which a linearity limitation resulting from capacitor mismatch and power consumption are minimized. The present invention has been produced from the work supported by the IT R&D program of MIC (Ministry of Information and Communication)/IITA (Institute for Information Technology Advancement) [2006-S-006-01, Components/Module technology for Ubiquitous Terminals] in Korea.

2. Discussion of Related Art

In an image system, in order to process an image signal, a fine analog signal should be converted into a digital signal which is robust to noise, and conversion of from an analog signal to a digital signal is performed by an analog-to-digital converter (ADC).

A high resolution ADC which can discriminate small signals is necessary since image information output from a sensor can be very fine. In addition to the image system, communication systems and image processing application systems such as a mobile communication system, an asynchronous digital subscriber loop (ADSL) system, an IMT-2000 system, a digital camcorder system, and a high definition television (HDTV) also need a high performance ADC which has a high resolution of a 12-bit level to a 14-bit level and a high sampling speed of tens of megahertz level.

Among various conventional ADCs, an algorithm ADC is widely used to optimize power consumption and the chip area size, and a structure of such an algorithm ADC is shown in FIG. 1.

FIG. 1 is a circuit diagram illustrating a conventional algorithm ADC.

As shown in FIG. 1, the conventional algorithm ADC comprises a sample-and-hold amplifier (SHA) 1 for sampling and holding an input analog voltage, a flash ADC 3 for converting the input analog signal into a digital signal and outputting the digital signal, a multiplying digital-to-analog converter (MDAC) 5 for converting a difference between the digital signal output from the flash ADC 3 and a signal output from the SHA 1 into an analog signal and outputting the analog signal, and a digital correction circuit 7 for correcting an error of the digital signal output from the flash ADC 3. The algorithm ADC of FIG. 1 has an overall n-bit resolution.

In the conventional algorithm ADC, the MDAC 5 comprises one amplifier and a plurality of capacitors. A mismatch between the capacitors affects differential nonlinearity of the whole ADC, so that the given resolution is limited.

In order to resolve the above problem, U.S. Pat. No. 6,097, 326 discloses an algorithm ADC with reduced differential nonlinearity in which capacitor connections are different from each other and output analog values are added, so that an effect of a mismatch between the capacitors is minimized.

The algorithm ADC with reduced differential nonlinearity is configured such that two analog values output through different capacitor connections are added to thereby remove the effect of a capacitor mismatch. A maximum analog value which can be processed in an analog area is restricted, and thus the size of each signal should be reduced to half before being processed in order to add the two output values. In a case where the size of each signal is reduced to half, a signal to noise ratio (SNR) to each analog signal (thermal noise excluding an SNR caused from a capacitor mismatch and SNR generated in an amplifier) is relatively increased.

The technique for removing a mismatch in the analog area, which is applied to the algorithm ADC with reduced differential nonlinearity, has the following problems. First, the SNR is 6 dB lower compared to a case where the mismatch removing technique is not applied, and if a first analog output value and a second analog output value are added the SNR is increased by 3 dB in total, because the SNR does not have a correlation. Thus, the use of the mismatch removing technique leads to SNR improvement by 3 dB, but results in a total SNR loss by 3 dB, which limits linearity of the ADC, unlike nonuse of the mismatch removing technique.

Also, since a signal conversion operating cycle is constant, due to the conventional algorithm ADC's use of a constant clock cycle, more than the necessary power may be consumed during even a cycle for outputting a low bit.

In more detail, in the algorithm ADC structure, a signal on an output terminal of the MDAC is required to have a $$\frac{1}{2^{n-i}}$$

accuracy level at an i-th clock phase, and since an operating speed of the amplifier required in the i-th MDAC is in proportion to $\ln(2^{n-i})$, the MDAC is designed to have an $$\frac{n-i}{n-(i+1)}$$

faster operating speed at an i-th clock phase than at (i+1)-th clock phase.

For example, in a 12-bit ADC, since the MDAC should output a signal at a first clock phase with the accuracy of 11 bits, and at a second clock phase with the accuracy of 10 bits, an operation of the MDAC at the first clock phase has to be 11/10 faster than an operation of the MDAC at the second clock phase. On the other hand, since the MDAC has the accuracy of 2 bits at the last clock phase (11-th clock phase), it can have a 2/11 lower operating speed than the first clock phase.

However, since the MDAC uses the same clock frequency at each phase, there is a problem in the conventional algorithm ADC in that more than the necessary power may be consumed at a clock phase for outputting a low bit.

In order to resolve the above problem, provided is a technique for minimizing power consumption at each phase in which a phase delay circuit is used to generate an appropriate delay signal, and cycles of respective clock phases which are different from each other are sequentially reduced by using the appropriate delay signal.

However, since the above described technique uses the delay signal, the cycle of each clock phase may be inaccurately controlled, whereby it can be difficult to achieve optimization of power consumption.

SUMMARY OF THE INVENTION

The present invention is directed to an algorithm ADC in which two digital output signals are obtained through different capacitor connections for one analog input signal, and the digital output signals are added to obtain a final output value, whereby a linearity limitation resulting from a capacitor mismatch is minimized.

The present invention is also directed to an algorithm ADC in which the operating clock frequencies become different according to the required resolution by making an operating frequency slow at a cycle requiring high resolution, and making the operating frequency fast at a cycle requiring low resolution, thereby minimizing power consumption.

An aspect of the present invention provides an algorithm analog-to-digital converter (ADC), comprising: a sample-and-hold amplifier (SHA) for sampling and holding an input analog voltage; two flash ADCs for converting one analog input signal into two digital signals n1 and n2 through different capacitor connections and outputting the two digital signals; one multiplying digital-to-analog converter (MDAC) for amplifying a difference between an output voltage Vs of the SHA and a reference voltage ±Vref through different capacitor connections according to the digital signals output from the flash ADCs and outputting the amplified difference to the flash ADCs again; a sequential multiphase clock generating circuit for outputting different operating clock frequencies according to the required resolution; and an output stage for adding the two digital signals n1 and n2 output from the flash ADCs to obtain a final output value.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, an exemplary embodiment of the present invention will be described in detail. However, the present invention is not limited to the embodiment disclosed below, but can be implemented in various forms. Therefore, the following embodiment is described in order for this disclosure to be complete and enabling to those of ordinary skill in the art.

Figure 2:
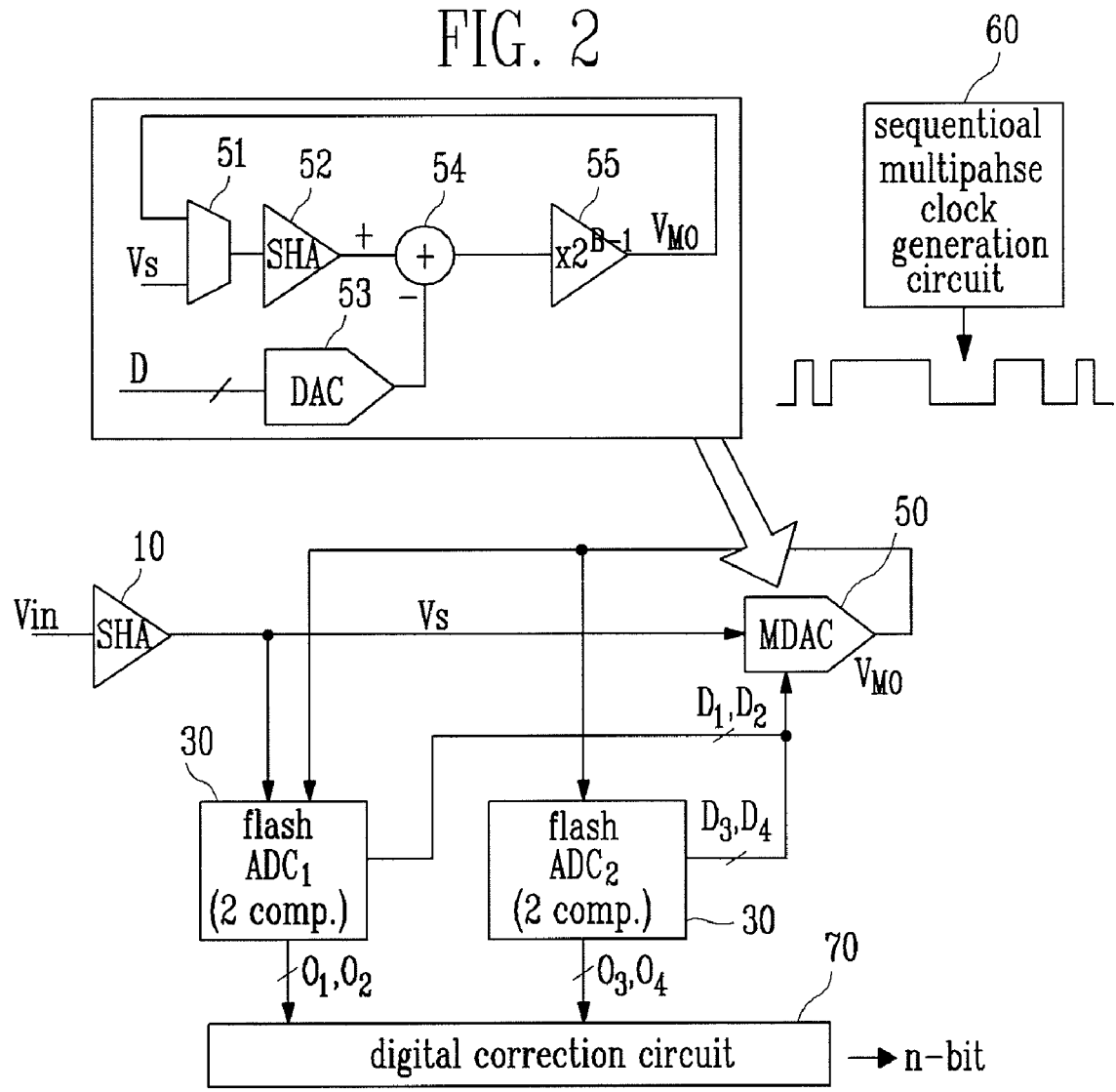
FIG. 2 is a circuit diagram illustrating an algorithm ADC according to an exemplary embodiment of the present invention.

FIG. 2 is a circuit diagram illustrating an algorithm ADC according to an exemplary embodiment of the present invention.

Figure 1:
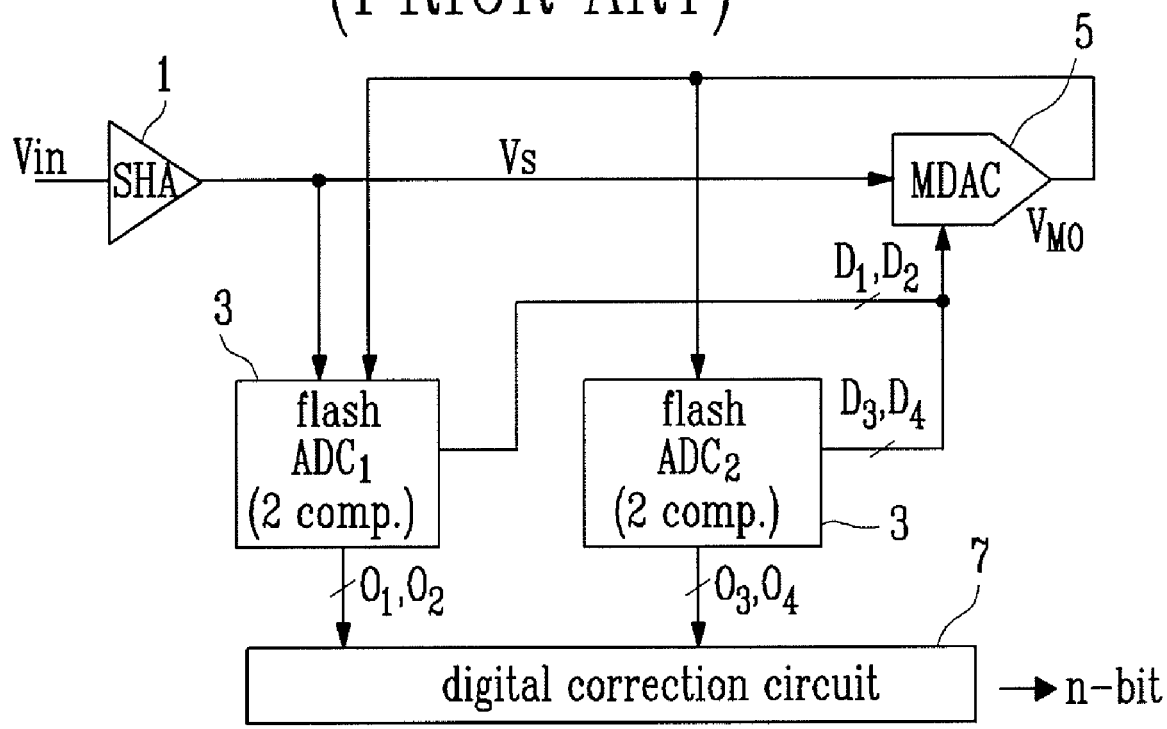
FIG. 1 is a circuit diagram illustrating a conventional algorithm ADC.

As shown in FIG. 2, the algorithm ADC comprises: an SHA 10 for sampling and holding an input analog voltage; two flash ADCs 30 for converting one analog input signal into two digital signals through different capacitor connections and outputting the digital signals; one MDAC 50 for amplifying a difference between an output voltage Vs of the SHA 10 and a reference voltage ±Vref through different capacitor connections according to the digital signals output from the flash ADCs 30 (the SHA 10 also outputting the amplified difference to the flash ADC 30 again); a sequential multiphase clock generating circuit 60 for outputting the operating clock frequency depending on the required resolution; and an output stage 70 for correcting an error of the digital signals output from the flash ADCs 30 and adding the digital output signals to obtain a final output value. The algorithm ADC of FIG. 1 has an overall n-bit resolution.

The algorithm ADC of the present invention is characterized in that power consumption is minimized by outputting the operating clock frequency depending on the required resolution, and a linearity limitation resulting from a capacitor mismatch is minimized through different capacitor connections. A configuration and an operation of the inventive algorithm ADC related to the above features will now be described below in detail.

The sequential multiphase clock generating circuit 60 for outputting the operating clock frequency depending on the required resolution is described below.

Figure 3:
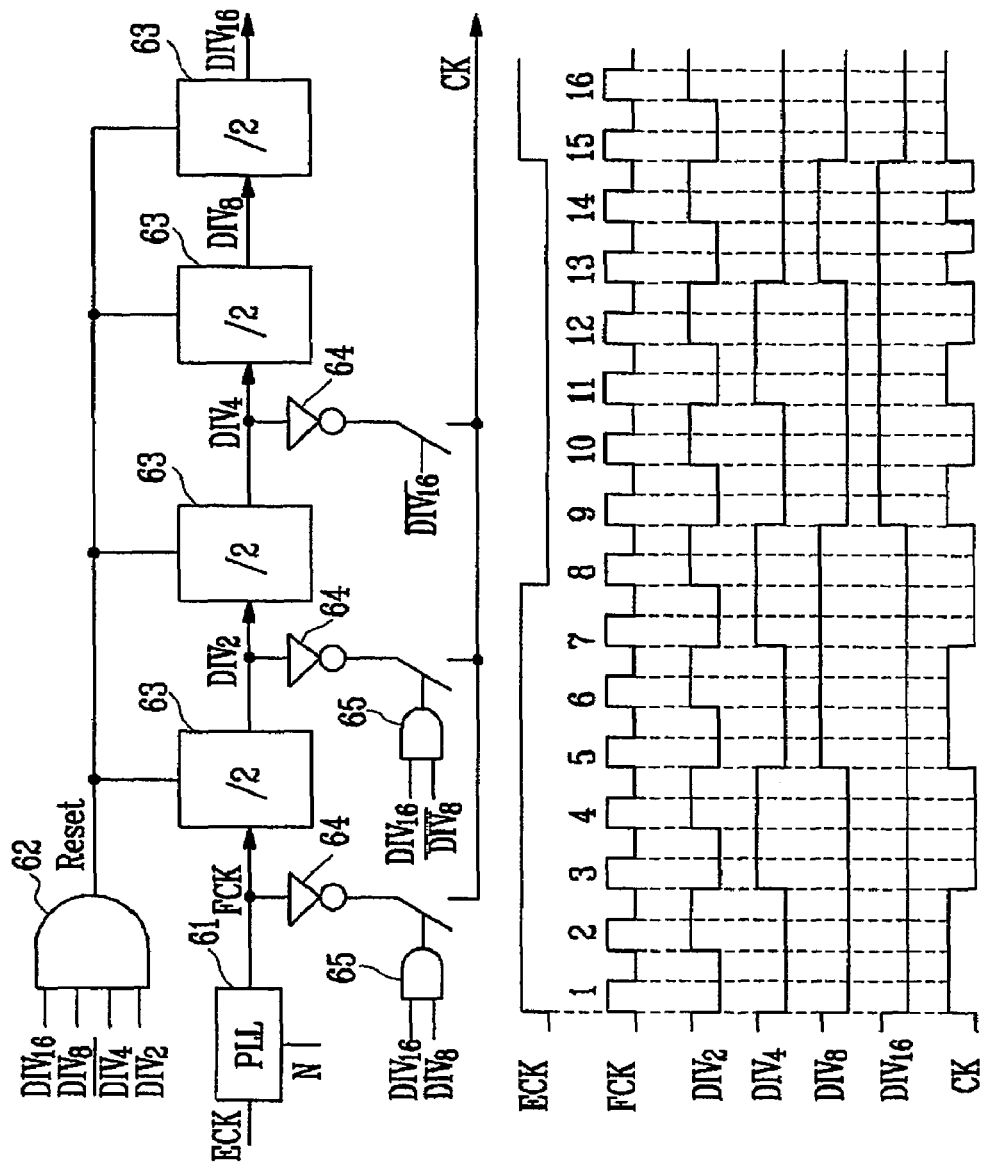
FIG. 3 illustrating a configuration and an operation of a sequential multiphase clock generating circuit according to the exemplary embodiment of the present invention.

FIG. 3 illustrates a configuration and an operation of the sequential multiphase clock generating circuit 60 according to the exemplary embodiment of the present invention. The sequential multiphase clock generating circuit 60 of FIG. 3 is one which is employed in a 13-bit ADC.

Referring to FIG. 3, the sequential multiphase clock generating circuit 60 is configured to generate a phase clock FCK having a cycle of N times from an external clock ECK through a phase locked loop (PLL) 61, and then to gradually reduce a clock cycle by using counters 62 to 65. Here, it is possible to apply a frequency of N times directly from an external portion without using the PLL 61.

In more detail, in order to design a 13-bit ADC, a signal of 6 cycles (12 phases) is required, and it is possible to optimize power consumption when a first phase has 6 times (12/2) cycle of the last phase. However, in consideration of a minimum time required in switching and easy implementation of a circuit, a phase having a cycle of 4 times, 2 times and one time is generated. The cycle having 4 times, 2 times and one time is applied sequentially according to output values of the counters 62 to 65 to finally output a clock signal CK, whose clock cycle is gradually reduced.

That is, the sequential multiphase clock generating circuit 60 outputs the clock signal CK whose clock cycle is gradually reduced during a cycle of (n−1)/2 times, that is, during a clock phase of (n−1) times.

Since the clock signal CK (whose clock cycle is gradually reduced) can be obtained through the sequential multiphase clock generating circuit 60, power consumption can be minimized by making the operating frequency slow at a cycle requiring high resolution and making the operating frequency fast at a cycle requiring low resolution, that is, outputting different operating clock frequencies according to the required resolution.

Next, a configuration and an operation of the flash ADC 30, the MDAC 50, and the output stage 70 for minimizing a linearity limitation resulting from a capacitor mismatch through different capacitor connections are described below.

Figure 4:
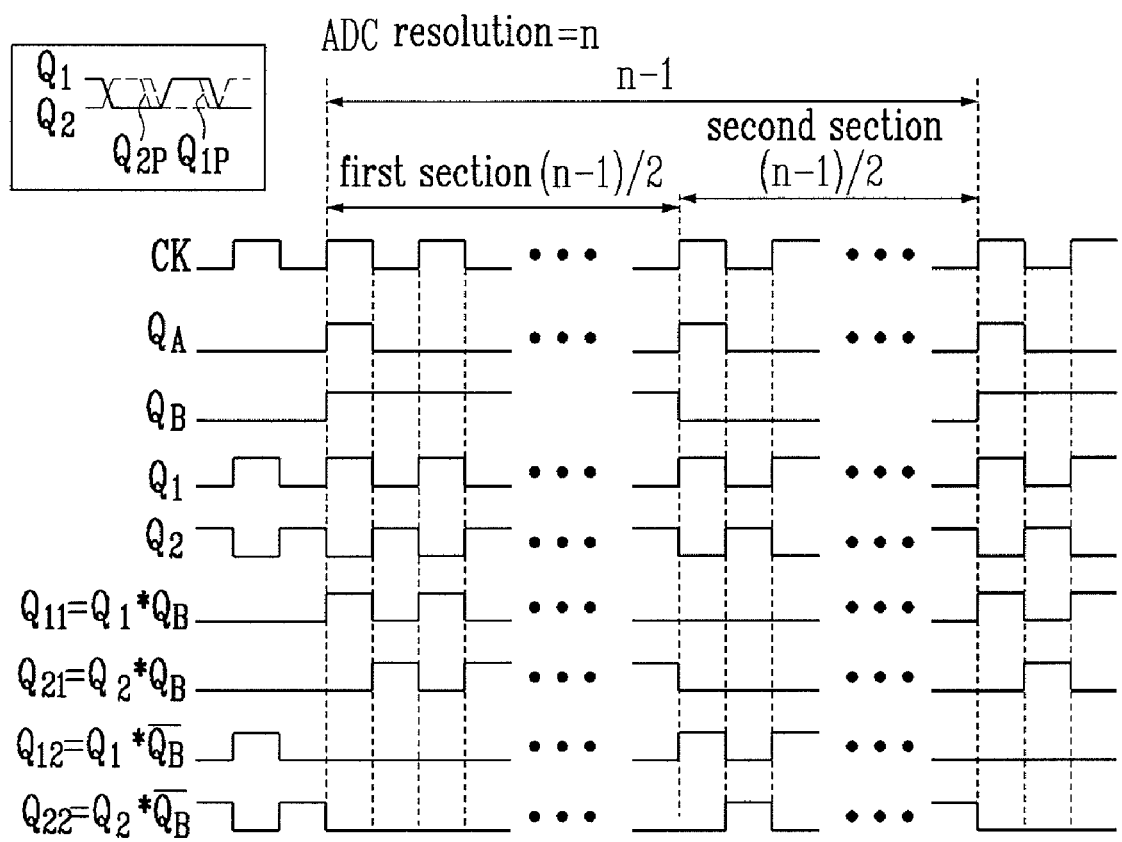
FIG. 4 is a timing diagram illustrating an operation of the algorithm ADC according to the exemplary embodiment of the present invention.
Figure 5:
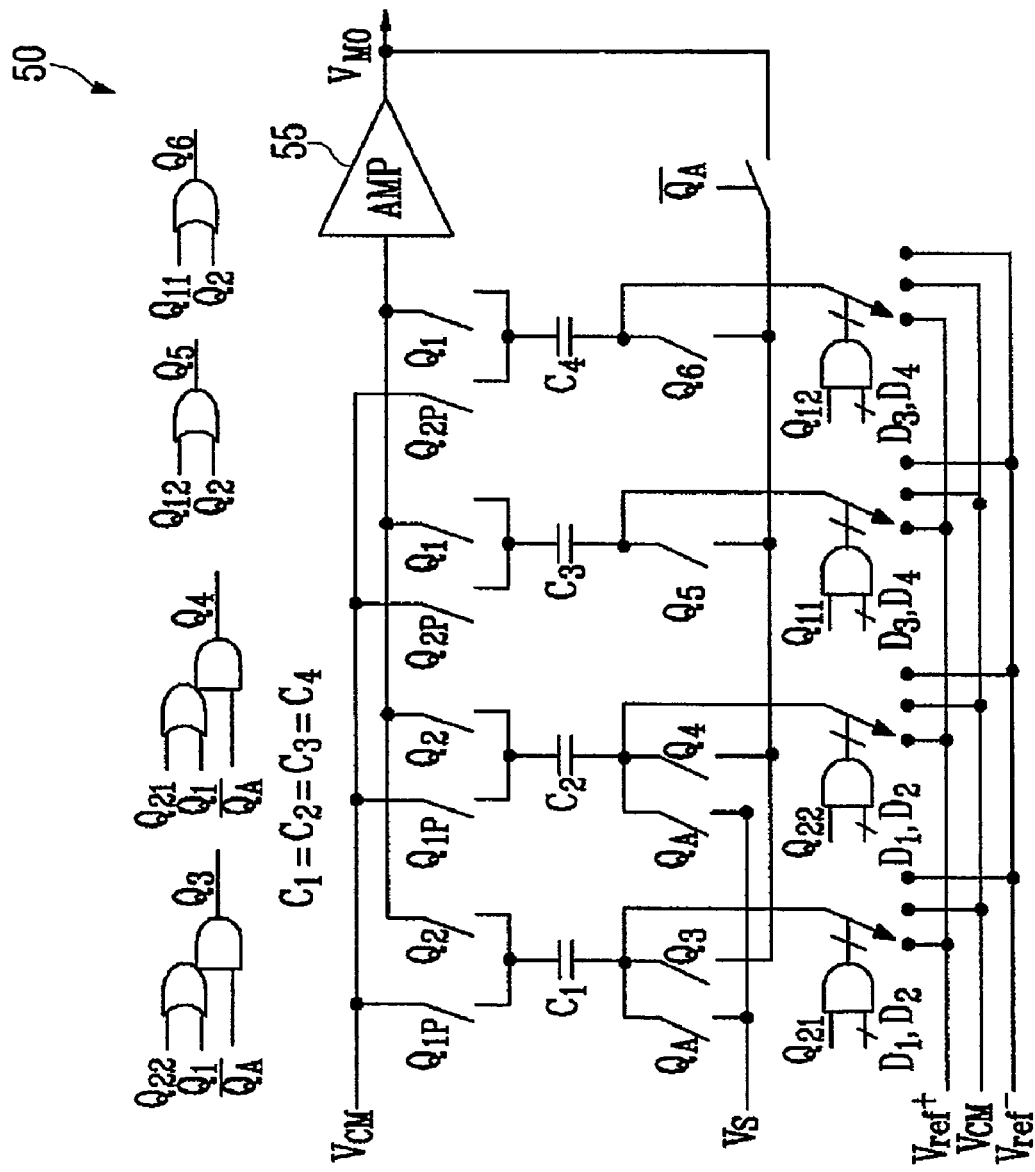
FIG. 5 is a circuit diagram illustrating a configuration of an MDAC of the algorithm ADC according to the exemplary embodiment of the present invention.
Figure 6:
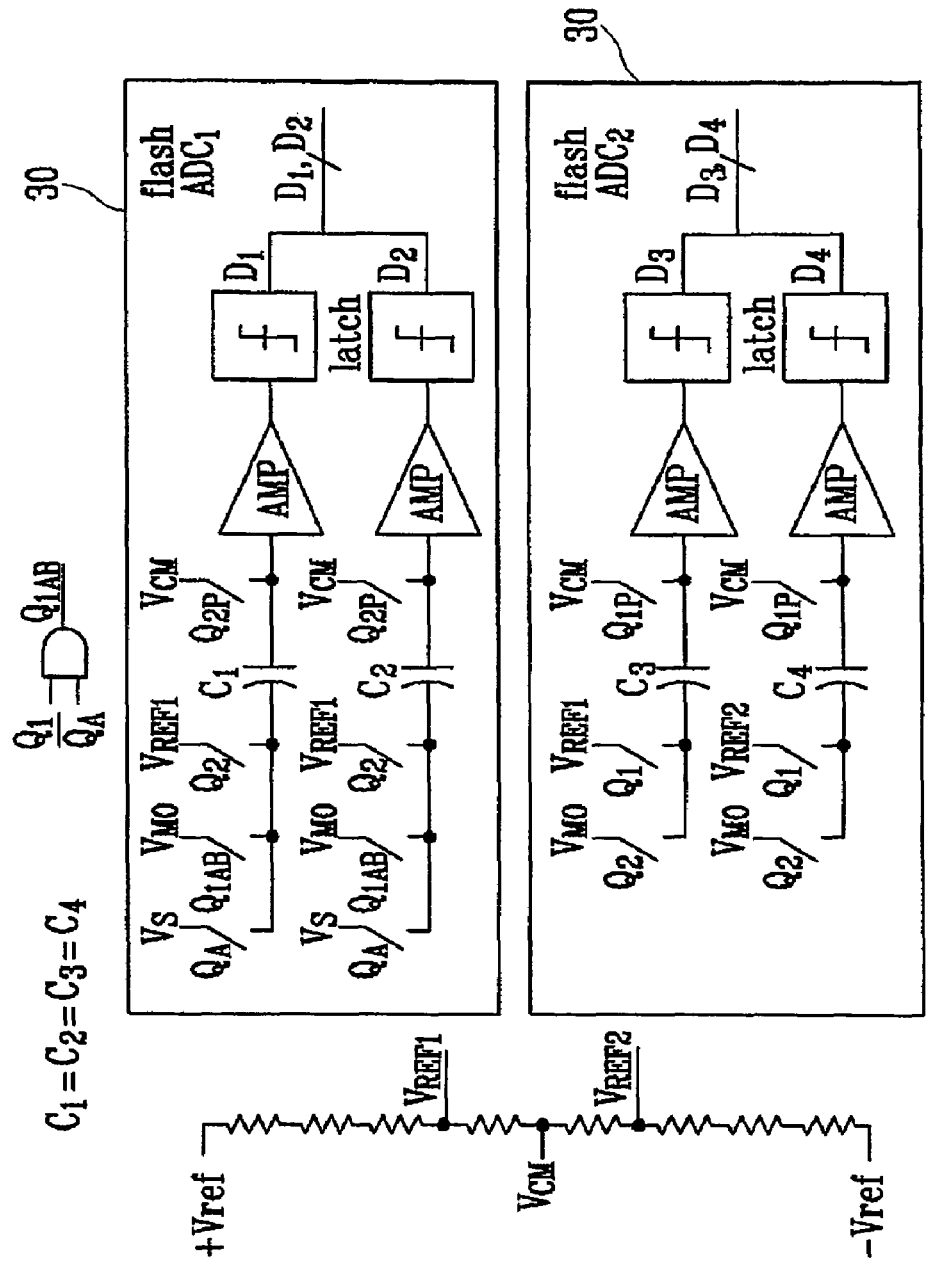
FIG. 6 is a circuit diagram illustrating a configuration of a flash ADC of the algorithm ADC according to the exemplary embodiment of the present invention.
Figure 7:
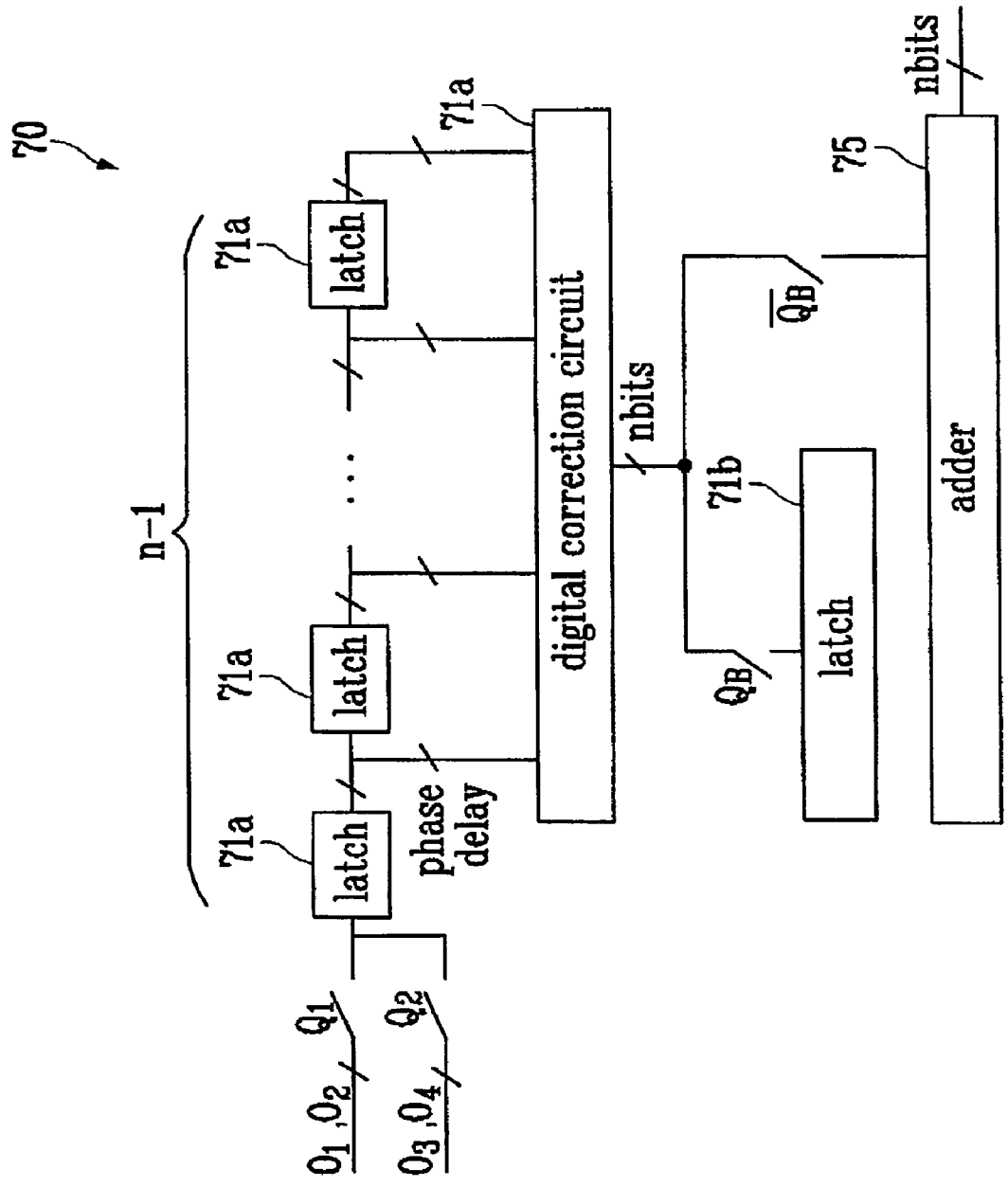
FIG. 7 is a circuit diagram illustrating a configuration of an output stage of the algorithm ADC according to the exemplary embodiment of the present invention.

FIG. 4 is a timing diagram illustrating an operation of the algorithm ADC according to the exemplary embodiment of the present invention; FIG. 5 is a circuit diagram illustrating a configuration of the MDAC 50 of the algorithm ADC according to the exemplary embodiment of the present invention; FIG. 6 is a circuit diagram illustrating a configuration of the flash ADC 30 of the algorithm ADC according to the exemplary embodiment of the present invention; and FIG. 7 is a circuit diagram illustrating a configuration of the output stage 70 of the algorithm ADC according to the exemplary embodiment of the present invention.

First, as shown in FIG. 4, the whole (n−1) clock cycle is divided into a first section (n−1)/2 cycle and a second section (n−1)/2 cycle, and for each section (n−1)/2 cycle, $Q_{11}$, $Q_{12}$, $Q_{21}$, and $Q_{22}$ are generated by using $Q_B$, $Q_1$ and $Q_2$.

Referring to FIGS. 5 and 6, in the MDAC 50 the output voltage Vs of the SHA 10 is sampled in $C_1$ and $C_2$ at a first $Q_A$ phase, +Vref ($D_1,D_2$=11), $V_{CM}$ ($D_1,D_2$=10), −Vref ($D_1,D_2$=00) are connected to $C_1$ according to $D_1$ and $D_2$ input from the flash $ADC_1$ 30 at a $Q_2$ phase of the first section, and $C_2$ is used as a feedback capacitor to amplify a difference between the output voltage Vs of the SHA 10 and the reference voltage ±Vref.

If $C_1$ and $C_2$ are identical in an ideal case, an amplification ratio is 2, but if $C_2=C_1+\alpha$ is assumed due to a mismatch "α" in an actual case, the output voltage $VMO_1(Q_2)$ of the MDAC at a $Q_2$ phase of the first section can be defined by Equation 1:

$$V_{MO1}(Q_2) = \left(\frac{2C_1 + \alpha}{C_1 + \alpha}\right) \cdot \left(V_S - \frac{k_2}{2}\right) \quad \text{Equation 1}$$

$$(D_1D_2 = 11 \rightarrow k_2 = +V_{REF},$$
$$D_1D_2 = 10 \rightarrow k_2 = 0, D_1D_2 = 00 \rightarrow k_2 = -V_{REF})$$

Here, $C_3$ and $C_4$ are connected to the output stage to perform a sampling for the output value.

At a next clock phase $Q_1$, $C_3$ is connected to the reference voltage ±Vref according to $D_3$ and $D_4$ input from the flash $ADC_2$ 30, and $C_4$ is used as a feedback capacitor to amplify a difference between the output voltage Vs of the SHA 10 and the reference voltage ±Vref.

If $C_4=C_3+\alpha$ is assumed, the output voltage $V_{MO1}(Q_1)$ of the MDAC at a Q1 phase of the first section can be defined by Equation 2:

$$V_{MO1}(Q_1) = \left(\frac{2C_3 + \beta}{C_3 + \beta}\right) \cdot \left(V_{MO1}(Q_2) - \frac{k_1}{2}\right) = \quad \text{Equation 2}$$
$$\left(\frac{2C_3 + \beta}{C_3 + \beta}\right) \cdot \left(\left(\frac{2C_1 + \alpha}{C_1 + \alpha}\right) \cdot \left(V_S - \frac{k_2}{2}\right) - \frac{k_1}{2}\right)$$

$$(D_3D_4 = 11 \rightarrow k_1 = +V_{REF}, D_3D_4 = 10 \rightarrow k_1 = 0,$$
$$D_3D_4 = 00 \rightarrow k_1 = -V_{REF}).$$

Here, $C_1$ and $C_2$ are connected to the output stage to perform a sampling for the output value, and the same procedure is repeated at the next phase.

If the above described procedure is repeated (n−1) times, an n-bit digital output n1 is obtained after an (n−1)/2 cycle.

After the first digital output n1 is obtained at a (n−1)/2 cycle through the above described procedure, a difference between the output voltage Vs of the SHA 10 and the reference voltage ±Vref is amplified at the second section (n−1)/2 cycle by changing roles of $C_1$ and $C_2$ and roles of $C_3$ and $C_4$ with each other, that is, by using $C_1$ as a feedback capacitor at a $Q_2$ cycle and by using $C_3$ as a feedback capacitor at a $Q_1$ cycle, which is described below in detail.

First, +Vref ($D_1,D_2$=11), $V_{CM}$ ($D_1,D_2$=10), −Vref ($D_1,D_2$=00) are connected to $C_2$ according to $D_1$ and $D_2$ input from the flash $ADC_1$ 30 at a $Q_2$ phase of the second section, and $C_1$ is used as a feedback capacitor to amplify a difference between the output voltage Vs of the SHA 10 and the reference voltage ±Vref.

If it is assumed that $C_2=C_1+\alpha$, the output voltage $VMO_2(Q_2)$ of the MDAC at a $Q_2$ phase of the second section can be defined by Equation 3:

$$V_{MO2}(Q_2) = \left(\frac{2C_1 + \alpha}{C_1}\right) \cdot \left(V_S - \frac{k_2}{2}\right) \quad \text{Equation 3}$$

$$(D_1D_2 = 11 \rightarrow k_2 = V_{REF},$$
$$D_1D_2 = 10 \rightarrow k_2 = 0, D_1D_2 = 00 \rightarrow k_2 = V_{REF}).$$

Here, $C_3$ and $C_4$ are connected to the output stage to perform a sampling for the output value.

At a next clock phase $Q_1$, $C_4$ is connected to the reference voltage ±Vref according to $D_3$ and $D_4$ input from the flash $ADC_2$ 30, and $C_3$ is used as a feedback capacitor to amplify a difference between the output voltage Vs of the SHA 10 and the reference voltage ±Vref.

If it is assumed that C4=C3+α, the output voltage VMO2 (Q1) of the MDAC at a Q1 phase of the second section can be defined by Equation 4:

$$V_{MO2}(Q_1) = \left(\frac{2C_3 + \beta}{C_3}\right) \cdot \left(V_{MO1}(Q_2) - \frac{k_1}{2}\right) = \quad \text{Equation 4}$$
$$\left(\frac{2C_3 + \beta}{C_3}\right) \cdot \left(\left(\frac{2C_1 + \alpha}{C}\right) \cdot \left(V_S - \frac{k_2}{2}\right) - \frac{k_1}{2}\right)$$

$$(D_3D_4 = 11 \rightarrow k_1 = V_{REF}, D_3D_4 = 10 \rightarrow k_1 = 0,$$
$$D_3D_4 = 00 \rightarrow k_1 = -V_{REF}).$$

Here, $C_1$ and $C_2$ are connected to the output stage to perform a sampling for the output value, and the same procedure is repeated at the next phase.

If the above described procedure is repeated (n−1) times, an n-bit digital output n2 is obtained after a (n−1)/2 cycle.

Meanwhile, referring to FIG. 7, the output stage 70 corrects an error of the digital signals output from the flash ADCs 30 and adds the digital output signals to obtain the final output value. The output stage 70 comprises a plurality of latches 71a and 71b, a digital correction circuit 73, and an adder 75.

The adder 75 adds the digital signals n1 and n2 output from the flash ADCs 30 to output the result of the addition as the final output value. Since such addition of the digital signals is identical to addition for adding an i-th analog output value and a ((n−1)/2+i)-th analog output value for one analog input, a final output value $V_{MO}(Q_2)$ at a $Q_2$ phase and a final output value $V_{MO}(Q_1)$ at a $Q_1$ phase can be represented as an analog signal by Equation 5:

$$V_{MO}(Q_2) =$$  Equation 5

$$V_{MO1}(Q_2) + V_{MO2}(Q_2) = \left(\frac{2C_1 + \alpha}{C_1} + \frac{2C_1 + \alpha}{C_1 + \alpha}\right) \cdot \left(V_S - \frac{k_2}{2}\right) \cong$$

$$\left(\frac{2C_1^2 + 2C_1\alpha}{C_1^2 + C_1\alpha}\right) \cdot \left(V_S - \frac{k_2}{2}\right) = 2\left(V_S - \frac{k_2}{2}\right), (C_1 \ll \alpha)$$

$$V_{MO}(Q_1) = V_{MO1}(Q_1) + V_{MO2}(Q_1) =$$

$$\left(\frac{2C_3 + \beta}{C_3 + \beta}\right) \cdot \left(V_{MO1}(Q_2) - \frac{k_2}{2}\right) + \left(\frac{2C_3 + \beta}{C_3}\right) \cdot$$

$$\left(V_{MO2}(Q_2) - \frac{k_1}{2}\right) = \frac{k_1}{2}\left(\frac{2C_3 + \beta}{C_3} + \frac{2C_3 + \beta}{C_3 + \beta}\right) +$$

$$\left(V_S - \frac{k_2}{2}\right)\left[\left(\frac{2C_3 + \beta}{C_3 + \beta}\right) \cdot \left(\frac{2C_1 + \alpha}{C_2 + \alpha}\right) + \right.$$

$$\left.\left(\frac{2C_3 + \beta}{C_3}\right) \cdot \left(\frac{2C_1 + \alpha}{C_1}\right)\right] \cong \frac{k_1}{2}\left(\frac{4C_3 + 4C_3\beta}{C_3 + \beta}\right) +$$

$$\left(V_S - \frac{k_2}{2}\right)\left[\frac{8C_1^2C_2^2 + 8C_1C_2^2\alpha + 8C_1^3C_2\beta}{C_1^2C_2^2 + C_1C_2^2\alpha + C_1^2C_2\beta}\right] =$$

$$2k_1 + 8\left(V_S - \frac{k_2}{2}\right), (C_1, C_2 \ll \alpha, \beta).$$

As can be seen in Equation 5, the final output value output from the inventive algorithm ADC is a value obtained by amplifying the input analog voltage with a predetermined amplification ratio, and thus it is a value unrelated to each capacitor mismatch.

That is, the algorithm ADC of the present invention obtains two digital outputs through different capacitor connections for one analog input signal and adds the digital output signals to obtain the final output value, and thus there is an advantage in that a mismatch factor of the capacitor is removed, thereby minimizing a linearity limitation resulting from a capacitor mismatch.

The algorithm ADC of the present invention adds the two different digital values to obtain the final output, and thus the signal level is twice increased (by 6 dB), but the SNR is increased only by 3 dB since the two digital values do not have a correlation therebetween, whereby the SNR is increased by a total of 3 dB, thereby improving the SNR of the algorithm ADC.

The present invention has been described with a focus on the algorithm ADC, but the technique for minimizing the effect of a capacitor mismatch can be applied to a pipe line type ADC. In this instance, the ADC can have the same effect by dividing one analog input into an even cycle and an odd cycle, changing capacitors with each other to obtain the digital output values and adding the digital output values.

As described above, according to the present invention, the algorithm ADC of the present invention obtains two digital outputs through different capacitor connections for one analog input signal and adds the digital output signals to obtain the final output value, and thus there is an advantage in that a mismatch factor of the capacitor is removed to minimize a linearity limitation resulting from a capacitor mismatch and the SNR of the algorithm ADC is improved.

In addition, the algorithm ADC of the present invention minimizes power consumption by making the operating frequency slow at a cycle requiring the high resolution and making the operating frequency fast at a cycle requiring the low resolution, i.e., outputting the different operating clock frequencies according to the required resolution.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An algorithm analog-to-digital converter (ADC), comprising:
    a sample-and-hold amplifier (SHA) for sampling and holding an input analog voltage;
    two flash ADCs for converting one analog input signal into two digital signals n1 and n2 through different capacitor connections and outputting the two digital signals;
    one multiplying digital-to-analog converter (MDAC) for amplifying a difference between an output voltage Vs of the SHA and a reference voltage ±Vref through different capacitor connections according to the digital signals output from the flash ADCs and outputting the amplified difference to the flash ADCs again;
    a sequential multiphase clock generating circuit for outputting different operating clock frequencies according to the required resolution; and
    an output stage for adding the two digital signals n1 and n2 output from the flash ADCs to obtain a final output value.

2. The algorithm ADC of claim 1, wherein the sequential multiphase clock generating circuit outputs a clock signal whose clock cycle is gradually reduced during a clock phase of (n−1) times.

3. The algorithm ADC of claim 1, wherein the sequential multiphase clock generating circuit outputs a clock signal of a low frequency at a cycle requiring a high resolution, and a clock signal of a high frequency at a cycle requiring a low resolution.

4. The algorithm ADC of claim 1, wherein the flash ADCs output an n-bit digital signal n1 at a (n−1)/2 cycle of a first section and an n-bit digital signal n2 at a (n−1)/2 cycle of a second section.

5. The algorithm ADC of claim 4, wherein the MADC operates at the (n−1)/2 cycle of the first section such that a second capacitor $C_2$ amplifies a difference between the output voltage Vs and the reference voltage ±Vref at a second phase $Q_2$, and a fourth capacitor $C_4$ amplifies a difference between the output voltage Vs and the reference voltage ±Vref at a first phase $Q_1$.

6. The algorithm ADC of claim 5, wherein an output $V_{MO1}(Q_2)$ of the MDAC at a second phase $Q_2$ of the first section is defined by:

$$V_{MO1}(Q_2) = \left(\frac{2C_1 + \alpha}{C_1 + \alpha}\right) \cdot \left(V_S - \frac{k_2}{2}\right)$$

$$(D_1D_2 = 11 \to k_2 = +V_{REF},$$

$$D_1D_2 = 10 \to k_2 = 0, D_1D_2 = 00 \to k_2 = -V_{REF}),$$

where $C_2 = C_1 + \alpha$.

7. The algorithm ADC of claim 5, wherein an output $V_{MO1}(Q_1)$ of the MDAC at a first phase $Q_1$ of the first section is defined by:

$$V_{MO1}(Q_1) = \left(\frac{2C_3 + \beta}{C_3 + \beta}\right) \cdot \left(V_{MO1}(Q_2) - \frac{k_1}{2}\right) =$$

$$\left(\frac{2C_3 + \beta}{C_3 + \beta}\right) \cdot \left(\left(\frac{2C_1 + \alpha}{C_1 + \alpha}\right) \cdot \left(V_S - \frac{k_2}{2}\right) - \frac{k_1}{2}\right)$$

$$(D_3D_4 = 11 \to k_1 = +V_{REF}, D_3D_4 = 10 \to k_1 = 0,$$

$$D_3D_4 = 00 \to k_1 = -V_{REF}),$$

where $C_4 = C_3 + \alpha$.

8. The algorithm ADC of claim 4, wherein the MADC operates at the (n−1)/2 cycle of the second section such that a first capacitor $C_1$ amplifies a difference between the output voltage Vs and the reference voltage ±Vref at a second phase $Q_2$, and a third capacitor $C_3$ amplifies a difference between the output voltage Vs and the reference voltage ±Vref at a first phase $Q_1$.

9. The algorithm ADC of claim 8, wherein an output $V_{MO2}$ ($Q_2$) of the MDAC at the second phase $Q_2$ of the second section is defined by:

$$V_{MO2}(Q_2) = \left(\frac{2C_1+\alpha}{C_1}\right)\cdot\left(V_S - \frac{k_2}{2}\right)$$

$(D_1 D_2 = 11 \rightarrow k_2 = V_{REF},$
$D_1 D_2 = 10 \rightarrow k_2 = 0, D_1 D_2 = 00 \rightarrow k_2 = V_{REF}),$ where $C_2 = C_1 + \alpha$.

10. The algorithm ADC of claim 8, wherein an output $V_{MO2}$ ($Q_1$) of the MDAC at the first phase $Q_1$ of the second section is defined by:

$$V_{MO2}(Q_1) = \left(\frac{2C_3+\beta}{C_3}\right)\cdot\left(V_{MO1}(Q_2) - \frac{k_1}{2}\right) =$$
$$\left(\frac{2C_3+\beta}{C_3}\right)\cdot\left(\left(\frac{2C_1+\alpha}{C_1}\right)\cdot\left(V_S - \frac{k_2}{2}\right) - \frac{k_1}{2}\right)$$

$(D_3 D_4 = 11 \rightarrow k_1 = V_{REF}, D_3 D_4 = 10 \rightarrow k_1 = 0,$
$D_3 D_4 = 00 \rightarrow k_1 = -V_{REF}),$ where $C_4 = C_3 + \alpha$.

11. The algorithm ADC of claim 1, wherein the output stage comprises:
a plurality of latches for storing the digital signals output from the flash ADCs;
a digital correction circuit for correcting an error of the digital signals output from the flash ADCs; and
an adder for adding the two digital signals output from the flash ADCs to output the final output value.

12. The algorithm ADC of claim 7, wherein the final output value $V_{MO}(Q_1)$ at the first phase $Q_1$ is defined by:

$$V_{MO}(Q_1) = V_{MO1}(Q_1) + V_{MO2}(Q_1) =$$
$$\left(\frac{2C_3+\beta}{C_3+\beta}\right)\cdot\left(V_{MO1}(Q_2) - \frac{k_1}{2}\right) + \left(\frac{2C_3+\beta}{C_3}\right)\cdot\left(V_{MO2}(Q_2) - \frac{k_1}{2}\right) =$$
$$\frac{k_1}{2}\left(\frac{2C_3+\beta}{C_3} + \frac{2C_3+\beta}{C_3+\beta}\right) +$$
$$\left(V_S - \frac{k_2}{2}\right)\left[\left(\frac{2C_3+\beta}{C_3+\beta}\right)\cdot\left(\frac{2C_1+\alpha}{C_1+\alpha}\right) + \left(\frac{2C_3+\beta}{C_3}\right)\cdot\left(\frac{2C_1+\alpha}{C_1}\right)\right] \cong$$
$$\frac{k_1}{2}\left(\frac{4C_3+4C_3\beta}{C_3+\beta}\right) + \left(V_S - \frac{k_2}{2}\right)\left[\frac{8C_1^2C_2^2 + 8C_1C_2^2\alpha + 8C_1^2C_2\beta}{C_1^2C_2^2 + C_1C_2^2\alpha + C_1^2C_2\beta}\right] =$$
$$2k_1 + 8\left(V_S - \frac{k_2}{2}\right), (C_1, C_2 \ll \alpha, \beta).$$

13. The algorithm ADC of claim 6, wherein the final output value $V_{MO}(Q_2)$ at the second phase $Q_2$ is defined by:

$$V_{MO}(Q_2) = V_{MO1}(Q_2) + V_{MO2}(Q_2) =$$
$$\left(\frac{2C_1+\alpha}{C_1} + \frac{2C_1+\alpha}{C_1+\alpha}\right)\cdot\left(V_S - \frac{k_2}{2}\right) \cong \left(\frac{2C_1^2+2C_1\alpha}{C_1^2+C_1\alpha}\right)\cdot\left(V_S - \frac{k_2}{2}\right) =$$
$$2\left(V_S - \frac{k_2}{2}\right), (C_1 \ll \alpha).$$

* * * * *